United States Patent

Maruyama et al.

Patent Number: 5,994,893
Date of Patent: Nov. 30, 1999

[54] DRIVING APPARATUS FOR STEPPING MOTOR TYPE INSTRUMENT

[75] Inventors: Youji Maruyama; Kouichi Sato, both of Nagaoka, Japan

[73] Assignee: Nippon Seiki Co., Ltd., Niigata, Japan

[21] Appl. No.: 09/029,394

[22] PCT Filed: Jun. 19, 1997

[86] PCT No.: PCT/JP97/02126

§ 371 Date: Feb. 27, 1998

§ 102(e) Date: Feb. 27, 1998

[87] PCT Pub. No.: WO98/00684

PCT Pub. Date: Jan. 8, 1998

[30] Foreign Application Priority Data

Jun. 28, 1996 [JP] Japan .................................. 8-169740

[51] Int. Cl.⁶ .................. G01P 3/42; G01P 3/00
[52] U.S. Cl. .................. 324/144; 324/166; 702/142
[58] Field of Search .................. 324/144, 143, 324/146, 154 R, 160, 163, 166, 167, 161; 702/142, 145, 147, 148, 86, 96

[56] References Cited

U.S. PATENT DOCUMENTS 3,868,570   2/1975   Kopera, Jr. .............................. 324/166

FOREIGN PATENT DOCUMENTS

| 02085764 | 3/1990 | Japan . |
|---|---|---|
| 4-133200 | 5/1992 | Japan . |
| 8-152337 | 6/1996 | Japan . |
| 2 292 026 | 2/1996 | United Kingdom . |

Primary Examiner—Jay Patidar
Attorney, Agent, or Firm—McDermott, Will & Emery

[57] ABSTRACT

A stepping motor type instrument 6 has driving circuits 3, 4 for driving a stepping motor based on a digital signal corresponding to a measurement quantity and a needle 9 fixed to a driving shaft end of this stepping motor indicates the measurement quantity by pointing out a graduation 8 on a character panel 7 corresponding to the measurement quantity. Further this stepping motor type instrument contains processing means 3 in which a digital signal corresponding to the measurement quantity is input and converted to an indication angle data at a predetermined frequency, and delay means 4 in which a difference between continuous indication angle data front and back output by the processing means 3 at the conversion frequency is obtained and if the difference is larger than a predetermined value, the signal is converted so that its change is less than the predetermined value and continuous indication angle data is output, thereby preventing a step-out and carrying out operation securely following a change in the measurement quantity.

5 Claims, 3 Drawing Sheets

DRIVING APPARATUS FOR STEPPING MOTOR TYPE INSTRUMENT

TECHNICAL FIELD

This invention relates to a driving apparatus for a stepping motor type instrument which is used as an instrument movement easy to control digitally instead of a movable coil type ammeter, cross coil type rotary magnet type ammeter or the like and more particularly to a stepping motor type instrument which measures and indicates such a measurement value as a traveling speed of a vehicle, engine rotation speed or the like based on a frequency signal input proportional thereto.

BACKGROUND ART

Generally, in this type of the instrument, a needle fixed to a driving end of an instrument movement is rotated corresponding to an input signal and a measurement value is indicated by a correspondence to an indicator panel marked with a numeral or graduation indicating a quantity to be measured.

Particularly in the stepping motor, stepping operation of its magnet rotor is determined depending on the number of teeth of a comb tooth yoke and its formation pitch. To ensure a smooth rotary operation, the number of teeth is increased so as to make fine comb tooth pitch or so-called micro step driving is executed by driving signals. These styles are selected by an allowable size of the stepping motor depending on use condition or cost including the driving circuit.

Further, such a stepping motor is desired to be of small size regardless of any application purpose. Because a so-called PM type stepping motor is simply structured, the stepping motor has been easy to use because of improvement of the rotor magnet and comb tooth yoke.

Against digitalization (microcomputer control) of a processing circuit, a stepping motor in which pulse signal control is carried out has attracted public attention as a movement of an indication instrument in which an indicated value is read out by a needle by correspondence to a graduation on the character panel. For example, this is applicable for a traveling speed indicator or engine rotation meter of a vehicle and further by A/D processing on detection signals, it can be used also for a fuel gauge and thermometer. Currently, various proposals have been made for practical application as disclosed in Unexamined Published Japanese Patent Application No. 61-129575, Unexamined Published Japanese Patent Application No. 1-223312.

In a case when the stepping motor is used as a movement of an instrument like this one, unlike a vector follow-up type in which a rotary magnet follows in a direction of synthesis vector of a coil magnetic field like a cross coil type instrument, in many cases, a change amount of each predetermined frequency of input signal is obtained and a stepping drive is executed by each change amount. Because the magnetic pole of the rotary magnet is driven for each pitch of the comb tooth yoke or by micro step processing between the pitches, and therefore a general structure employed is that a position of the rotary magnet when power switch is ON is assumed to be an initial value (in an indication instrument, start point initialization processing is carried out by forcibly returning to a zero position on the character panel) and then the stepping drive is executed by each incremental or decremental amount of the input signal from this start point.

Therefore, due to mechanical influences upon the rotary magnet by external vibration on an instrument device, the angular position is deviated from that controlled by stepping drive from a start point, namely deviated from a proper positional relation between the comb tooth yoke and magnetic pole of the rotary magnet, so that the angle may deviate by one pitch. If such an angular deviation or so-called step-out occurs, the proper angular position is never indicated until start point is initialized by turning on the power, so that an angle including an error due to the step-out is indicated.

This kind of step-out phenomenon occurs when the rotary magnet does not follow up a change in input signal as well as due to mechanical deflection by external vibration or the like. That is, if a stepping drive torque relative to the rotary magnet of the stepping motor cannot be secured because of structural reason, driving current limitation or the like or if a change in input signal relative to a limit of such a driving torque or angular speed is too large, the rotary magnet cannot follow up so that step-out occurs repeatedly and finally a large angular error is caused.

Particularly in the stepping motor, the stepping motion corresponding to tooth pitch of the comb tooth yoke is basically employed and smoothness is obtained by correcting the waveform of the drive signals. However, such a smoothing processing is only smoothing between the tooth pitches of the comb tooth yoke, and therefore the step-out due to pitch-over still occurs. Thus, when the measurement quantity changes rapidly so that an accompanying change in input signal is rapid, exceeding a follow-up limit of the rotary magnet, the rotary magnet of the stepping motor cannot follow up so that an accurate indication characteristic as an indication instrument cannot be obtained.

Accordingly, it is an object of the present invention to execute securely follow-up of the rotary magnet and make it difficult to induce step-out by delaying the updating signal of the stepping motor if, with respect to indication angle data obtained by a processing means which calculates measurement data and converts to indication angle signal, a change in the data corresponding to a change in measurement quantity is large.

DISCLOSURE OF THE INVENTION

According to the present invention, there is provided a driving apparatus for stepping motor type instrument having a driving circuit for driving a stepping motor according to digital signal corresponding to a measurement quantity and for indicating the measurement quantity by pointing out a graduation on a character panel corresponding to the measurement quantity by means of a needle fixed on a driving shaft end of the stepping motor, the driving apparatus comprising: processing means in which a digital signal corresponding to the measurement quantity is input and converted to an indication angle signal at a predetermined frequency; and delay means which obtains a difference between continuous indication angle signals front and back output at a conversion frequency of the processing means and, if the difference is larger than a predetermined value, converts the signal so that its change is less than the predetermined value and outputs as an indication angle signal.

Further according to the present invention, there is provided a driving apparatus for stepping motor type instrument having a driving circuit for driving a stepping motor according to a digital signal corresponding to a measurement quantity and for indicating the measurement quantity by pointing out a graduation on a character panel corresponding to the measurement quantity by means of a needle fixed on a driving shaft end of the stepping motor, the driving apparatus comprising: a processing means for inputting a digital signal D corresponding to the measurement quantity and converting to an indication angle data A at a predetermined frequency; and delay means in which a difference ΔA of an updated indication angle data An+1 output by the processing means relative to a previous indication angle data An is obtained, and if this difference ΔA is larger than a predetermined value C in terms of its absolute value, the updated indication angle data An+1 is rewritten to An+C or An−C depending on its increase/decrease condition and this data is used as the previous indication angle data An for next processing so as to successively update and output the indication angle data.

Still further according to the present invention, there is provided a driving apparatus for stepping motor type instrument having a driving circuit for driving a stepping motor according to a digital signal corresponding to a measurement quantity and for indicating the measurement quantity by pointing out a graduation on a character panel corresponding to the measurement quantity by means of a needle fixed on a driving shaft end of the stepping motor, the driving apparatus comprising: processing means for inputting a digital signal D corresponding to the measurement quantity and converting to an indication angle data A at a predetermined frequency; and delay means in which a difference ΔAn of an updated indication angle data An+1 output by the processing means relative to a previous indication angle data An and a difference ΔAn−1 of the previous indication angle data relative to an indication angle data An−1 before the previous one are obtained, and if a difference between these change rates is larger than a predetermined value X in terms of its absolute value, the updated indication angle data An+1 is rewritten to 2An−An−1+K or 2An−An−1−K (where 0<K=<X) depending on its increase/decrease condition and this data is used as the indication angle data An before the previous one for next processing so as to successively update and output the indication angle data.

Yet still further according to the present invention, there is provided a driving apparatus for stepping motor type instrument mentioned above, wherein the delay means carries out disassembly step processing for (An+1−An)/m=Bh each at a frequency T/m (m is an integer of 2 or more) shorter than the updating frequency T of the indication angle data An and if an absolute value ΔBh of a difference of Bh+1−Bh is larger than a predetermined value E, the indication angle data Bh+1 is rewritten to Bh+E or Bh−E depending on its increase/decrease condition and this data is used as the indication angle data Bh for next processing so as to successively update the indication angle data.

Yet still further according to the present invention, there is provided a driving apparatus for stepping motor type instrument mentioned above wherein the delay means carries out disassembly step processing for (An+1−An)/m=Bh each at a frequency T/m (m is an integer of 2 or more) shorter than the updating frequency T of the indication angle data An, and a change rate of a difference ΔBh of Bh+1−Bh and a difference ΔBh−1 of Bh−Bh−1 are obtained, and if a difference of these change rates is larger than a predetermined value Y, the indication angle data Bh+1 is rewritten to 2Bh−Bh−1+L or 2Bh−Bh−1−L (where 0<L=<Y) depending on its increase/decrease condition and this data is used as said indication angle data Bh for next processing so as to successively update the indication angle data.

BEST MODE FOR CARRYING OUT THE INVENTION

Figure 1:
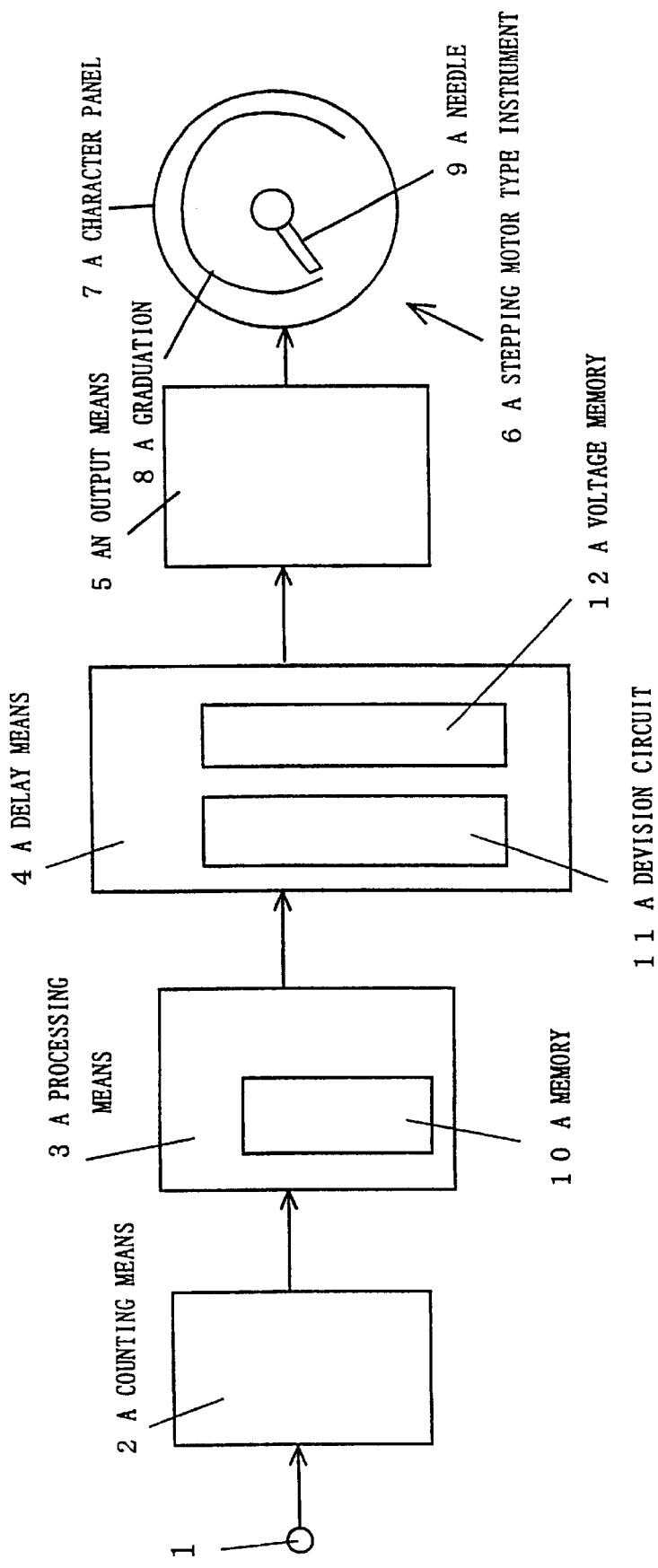
FIG. 1 is a circuit block diagram showing an embodiment of the present invention.

FIG. 1 indicates a basic structure of the present invention. A speedometer of a vehicle will be described as an example thereof. In the speedometer, a frequency signal proportional to a traveling speed which is a quantity to be measured is input through an input terminal 1. Counting means 2 detects rise or fall of the input signal to count this based on a predetermined gate time (gate time type). Or it counts another high frequency clock signal (frequency measurement type) and calculates changing traveling speeds in the form of digital data D.

The measured quantity obtained by the aforementioned counting means 2 is converted to an indication angle data A by processing means 3 at a predetermined conversion frequency T. Delay means 4 obtains an absolute value ΔA which is a difference between the aforementioned indication angle data An and an updated indication angle data An+1 and indicates an increase or decrease at each conversion angle T.

When this difference ΔA is larger than a predetermined value C set in viewpoints of mechanical structure of the stepping motor rotary magnet or a relation between the driving torque of the driving circuit and its follow-up limit, namely when An+1−An=ΔA>C so that the indication angle data is increasing, the delay means 4 determines the updated indication data An+1 by processing of An+1=An+C.

This output data of An+1=An+C is employed as a previous data for next updating, and by the same operation, comparison with the updated indication angle data An+1 and subsequent updating are repeated. The predetermined value C is set to a step angle which can be followed easily without step-out of the stepping motor rotary magnet. Therefore, even if the rotary magnet cannot follow up so that it steps out because a change from An to An+1 is too large, when data output is carried out following actual change, driving without step-out is enabled by delay processing by delay means 4.

Figure 2:
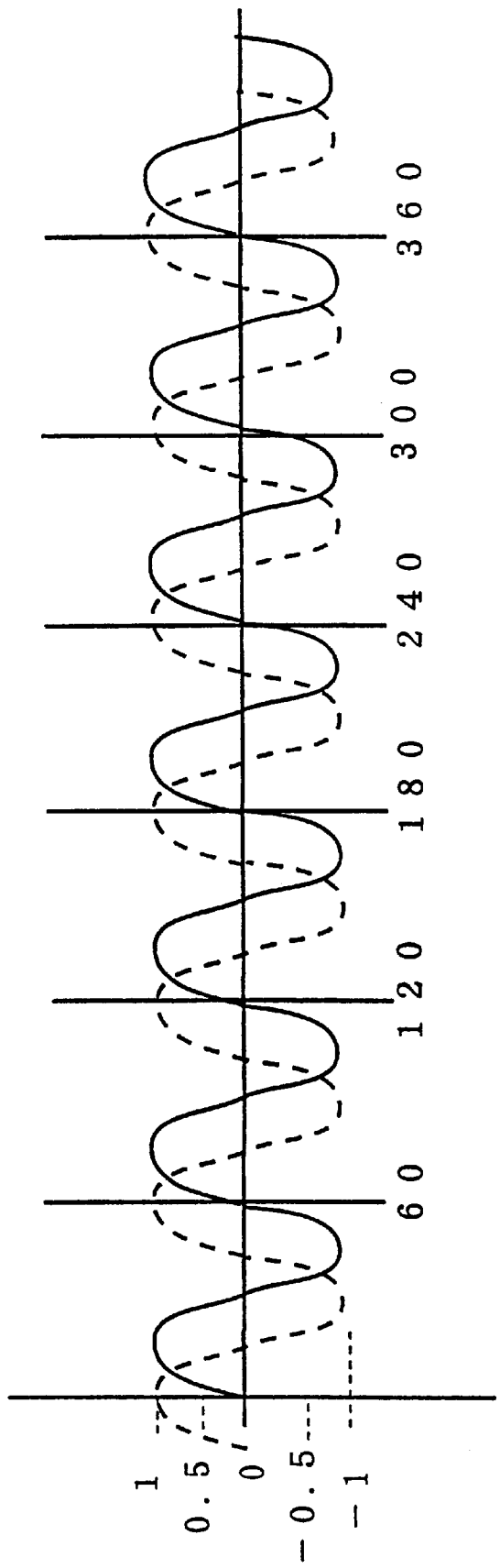
FIG. 2 is a driving waveform diagram showing an example of the stepping motor driving signal waveform of the present invention.

The change in the indication angle data A by the delay processing drive provides a change in a digital data D corresponding to actually measured quantity as shown in FIG. 2 with a delayed indication. However, actually an angular speed of the needle of the indicator upon normal acceleration or deceleration does not increase extremely, so that an indication with a delay according to the present invention hardly affects the actual traveling.

The indication angle data A subjected to delay processing by the delay means 4 as described above carries out appropriate waveform processing (micro-step waveform or phase conversion) for a two-phase excitation coil of the stepping motor through output means 5 and then is supplied. Then, the stepping motor type instrument 6 is driven so that a needle 9 fixed to the driving end is rotated by an angle indication corresponding to a graduation 8 of a character panel 7.

The aforementioned respective means processes input signals appropriately as a driving circuit and drives the stepping motor type instrument 6. The processing means 3 can be constructed by means of a microcomputer including the counting means 2 and the delay means 4 so as to be capable of indicating a traveling speed by arbitrarily setting instrumental indicative characteristic. Further, a memory (ROM) 10 storing an indication angle data A corresponding to the counted digital data D is provided, which fetches in the digital data D at a predetermined conversion frequency and outputs an indication angle data A at a memory address corresponding thereto.

This processing means 3 is effective for a case in which a cheap IC having a slow processing speed is used for driving a single indication instrument such as a speedometer described here or a case in which, when time-division driving is carried out at the same time for other indication instruments (not shown) such as engine rotation meter, fuel gauge, thermometer, oil pressure gauge, and voltmeter (these indication instruments may be of stepping motor type instruments or may be combined with other instrumental movement such as a cross coil type instrument, a movable coil type instrument and the like), a processing frequency to be allocated to a traveling speed meter is insufficient for obtaining a smooth response.

The storage about the indication angle data A which the processing circuit 3 makes in the memory 10 includes data sufficient for obtaining a desired resolution capacity corresponding to a previous indication range from MIN to MAX of the digital data D, corresponding to a measurement quantity. For example, the indication angle data A in the unit of 0.5 degrees is stored for the indication angle from 0° (MIN) to 360° (MAX) and this stored indication angle data An is read out at the predetermined conversion frequency T corresponding to the digital data D.

The delay circuit 4 comprises a division circuit 11 in which a difference between the indication angle data An output at the conversion frequency T from the processing circuit 3 and the indication angle data A1 to be output after the conversion frequency T from the previous indication angle data A0, namely an angular difference $\Delta A=(A1-A0)$ between continuous indication angle data front and back is obtained and when this difference is larger than the predetermined value C, this predetermined value C is added to A0 as an updated data and an angular data Bh corresponding to $\Delta A/m$ is successively output at each division frequency T/m (m is an integer of 2 or more) which is shorter than the conversion frequency T, and a voltage memory 12 for converting the indication angle data B of each division frequency T/m output from the division circuit 11 to two-phase driving signal for driving the stepping motor type instrument 6. Then, this signal is converted to a voltage signal as shown in FIG. 2 through the output circuit 5, this voltage signal being applied to the two-phase excitation coil of the stepping motor.

As the signal waveform for driving the stepping motor, an arbitrary two-phase signal can be set depending on the number of comb tooth yokes and pitch thereof. All driving waveform data corresponding to all indication angles of 360° can be stored in a voltage memory 12. However, here voltage data of 60° each which is 1/6 of 360° as a stepping motor drive signal for the stepping motor type instrument 6 is prepared in the voltage memory 12 and this data is used in respective angular areas so as to reduce the memory capacity.

The voltage waveform of the driving signal to be applied to the two-phase excitation coils A, B changes in the form of substantially SIN, COS shapes relative to the rotation angle of 360° of the needle 9 (combined magnet rotor) of the stepping motor type instrument 6, as shown in FIG. 2, so that this voltage waveform is spread over all angular areas a–f in which each angle is 60°. This spreading can be discriminated by the indication angle data A corresponding to the digital data D indication range. The voltage memory 12 is made to store a driving voltage data V (stored by angular difference of 60/128° from A0 corresponding to 0° to A60 corresponding to 60°) having a resolution capacity in which 60° is divided by 128. Corresponding to the digital data D, this voltage data V is read out. Corresponding to the digital data D having indication angle areas b–f, each indication area is discriminated and at the same time, the voltage data V in the discrimination area is read out from the voltage memory 12 and an indication position of the indication instrument can be determined by combination with that confirmation area.

If at least one pair of teeth of the comb tooth yoke of the stepping motor are allocated in each indication area shown in FIG. 2, the driving signal is not different depending on each indication area because magnet pole position of the magnet rotor is only moved to an excitation position within the area. Depending on discrimination of the indication area based on the digital data D, the voltage data V can be read out from the voltage memory 12. For example, if the digital data D corresponds to the indication angle of 150°, the indication area is determined to be c and by reading out a data equivalent to 30° within this area from the voltage memory 12, the driving signal as shown in FIG. 2 is obtained.

The driving waveform shown in FIG. 2 is a typical analogous waveform for obtaining smoothly mechanical step motion to be determined by the tooth pitch of the stepping motor. Actually, the SIN, COS waveforms are digitally fine waveforms. The pitch of the micro step is determined by a change speed of a measurement quantity indicated by an instrument or the angular speed of the needles and the processing capacity of a processing circuit.

The present applicant has constructed concrete indication instruments and experimented their characteristics based on the basic composition. The stepping motor which is an instrument movement for use in the stepping motor type instrument 6 employs a well-known PM structure in which an excitation coil conducting two-phase driving waveform is wound around two overlaid resin bobbins while comb tooth yokes are provided on upper and lower portions of each bobbin and a magnet rotor is rotatably journaled in a hollow portion of the overlaid body of this bobbin.

Six comb teeth are formed on each comb tooth yoke and they are opposed to each other such that 24 comb teeth are arranged on an entire circumference. Mechanical step pitches of 15° are provided and four comb teeth are arranged in the indication areas a–f of 60° each.

The processing circuit 3 carries out time-division driving which enables to drive other indication instruments and alarm by means of microcomputer. The conversion frequency T to be allocated to the traveling speedometer was set to 16 msec and the digital data D was changed with various angular speeds so as to observe a motion of the needle 9.

Setting of the division frequency T/m in the division circuit 11 by the delay circuit 4 was gradually carried out by changing the m. Under such division frequency T/m, the angular speed was changed and then it was confirmed that the needle 9 was smoothly rotated without step-out against a sudden change in the digital data D.

Actually, the conversion frequency was temporarily set at 16 msec and the angular speed $\omega$ was changed in a range from 10°/sec to 1080°/sec so that it was changed in the unit of 10°/sec in low speed range and in the unit of 100°/sec in high speed range. Under this condition, the frequency was increased from 16 msec in the unit of 1 msec as a short frequency and it was confirmed that the needle 9 was rotated smoothly.

Consequently, at any angular speed gradually set in this manner, a finally stabilized indication value did not step out and an indication position corresponding to an input indication data was indicated. That is, according to the conventional updating processing by only a predetermined updating frequency in which rewrite correction corresponding to a magnitude of change in the input value of the present invention is not performed, when the angular speed is too large, the magnet rotor which is a movable part of the stepping motor type instrument 6 cannot follow up so that it steps out. However, by the delay processing according to the present invention, a proper position can be indicated without step-out although there is a slight delay in follow-up.

Figure 3:
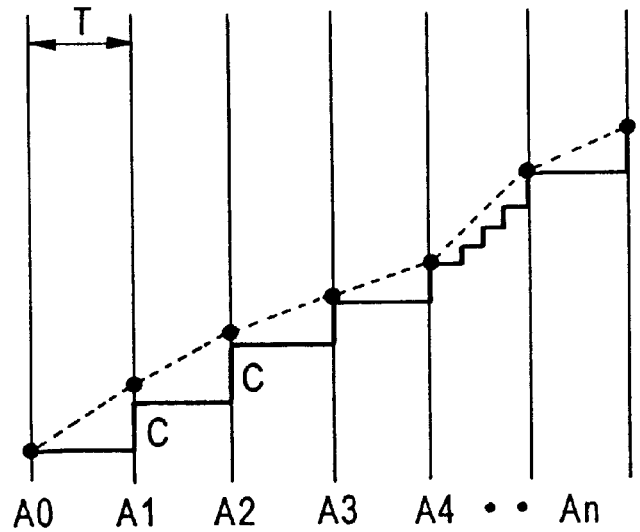
FIG. 3 is a step waveform diagram for explaining a delay operation at a conversion frequency of indication data according to the present invention.

That is, the digital data D of the counting means 2 which measures an angular speed which cannot be followed mechanically due to a structure of the stepping motor, that is, a change in measurement quantity, is converted to the indication angle data An by the processing means 3. If a change rate to the updated indication angle data An+1 or a difference ΔA by the delay means 4 is larger than the predetermined value C set corresponding to a change in the angular speed inducing the step-out in terms of their absolute values, an increase/decrease direction of that change is determined and An+1 is rewritten to An+C or An−C and then output. Further, this data is successively updated as the indication angle data for next processing. Consequently, by carrying out incremental/decremental correction (delay processing) by only the predetermined value C, which is a small change rate which can be followed sufficiently relative to a change in input data, corresponding to an angular speed which properly induces step-out, an accurate indication motion without step-out is enabled. This change in indication data by the delay processing can be explained by the change characteristic shown in FIG. 3.

If the conversion frequency T cannot be reduced by processing capacity of the processing means 3, by division processing for update output frequency by the delay means 4, it is possible to improve smoothness in indication and preventive characteristic of step-out.

That is, if the conversion frequency T cannot be reduced, a change width of updating data relative to a sudden change in the measurement quantity cannot be divided finely so that the updating data changes in a large volume. Thus, if the delay processing on An+C is simply carried out, step-out can be prevented but follow-up is too late. Consequently, a large delay is caused by the delay processing by the same comparative addition to a new data change of the magnet rotor to be input next. If there is a limit in the conversion frequency T like this, this delay can be eliminated by the division processing at the division frequency T/m by the division circuit 11 of the present invention and the same delay processing at each division frequency T/m.

That is, a division data Bh is obtained by dividing a difference between continuous indication angle data front and back (An+1−An) by division number m. The same processing as ordinary delay processing at the frequency T is performed. If an absolute value ΔBh which is a difference of Bh+1−Bh is larger than a predetermined value E, it is determined that the change width at the normal frequency T is very large and this value is rewritten to Bh+E or Bh−E depending on the incremental/decremental condition and output. Then, this data is used as the indication angle data Bh for the next processing, so that the update processing for the indication angle data is successively carried out.

Figure 4:
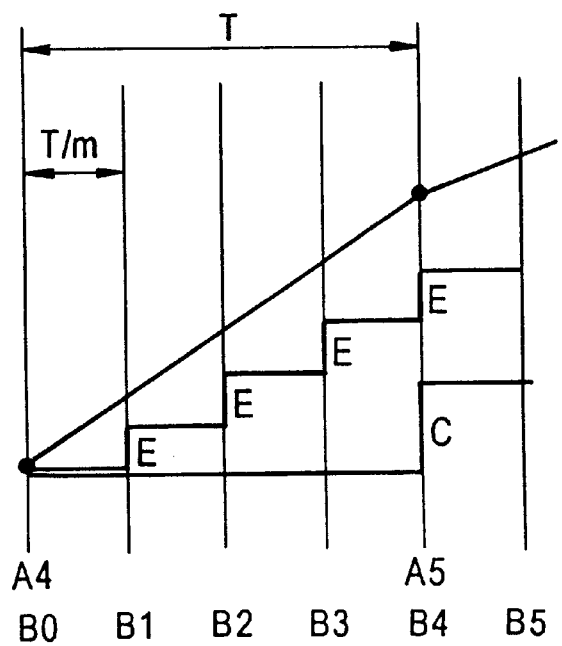
FIG. 4 is a division step waveform diagram for explaining delay processing at the division frequency of the indication data according to the present invention.

FIG. 4 shows a change characteristic of the indication angle data Bh when a division frequency T/m is set with m=4 with respect to the conversion frequency T. In the processing circuit 3 for converting the digital data D corresponding to a traveling speed according to a data table, the data is updated at the division frequency of T/4 with respect to the conversion frequency T which enables the data to be allocated to the speedometer. If the change in the indication angle data at the conversion frequency T or the difference ΔA between continuous indication angle data front and back is large, the change in the data Bh at each division frequency T/4 also becomes large. If the change (Bh+1−Bh) in this Bh is larger than the predetermined value E, additive processing of Bh+E is carried out so that the same delay processing is carried out successively at each frequency of T/4.

Thus, when the indication angle data An converted and output at each frequency T changes as shown by dotted line and a difference of the updating data between A0 and A1 or A1 and A2 provides such a larger change than C having a possibility of step-out, the delay processing is carried out by updating by adding the predetermined value C as shown by a solid line. As a result, the magnet rotor follows up its final indication position without step-out. Further, if the change of the indication angle data at the frequency T is very large like A4–A5, the follow-up is delayed. As shown in FIG. 4, the same delay processing is carried out by the indication angle data Bh (from B0 to B4) at the division frequency T/4 and by adding the predetermined value E, the follow-up is made smooth thereby preventing an occurrence of step-out excellently.

The necessity of the delay processing by the division frequency and the number of division should be determined depending on the characteristic of a stepping motor to be applied and a measurement object, so as to prevent a step-out in an ordinary measurement/indication range. Further, they should be determined appropriately depending on sampling of processing means and conversion processing capacity so as to cover these matters.

As a method for the delay processing, the method by addition or subtraction of the predetermined value C or E which is a simple difference between the continuous indication angle data An and Bn has been described above. Different from this method, differences between continuous indication angle data An and Bn are continuously obtained and then their change rates are compared. If a difference of the changes rates is larger than a predetermined value X or Y, the indication angle data is rewritten to 2An−An−1+K or 2An−An1−K (where 0<K=<X) or 2Bh−Bh−1+L or 2Bh−Bh−1−L(where 0<L=<Y) corresponding to its incremental or decremental direction and output. Further, by using this data as the indication angle data An or Bh for the next processing, the indication angle data is successively updated so that the delay processing enabling to prevent step-out is carried out.

Detailed description of this structure and processing step is omitted. This method is basically structured to suppress the indication angle data An or Bn corresponding to a measurement quantity at the frequency T or division frequency T/m to a change rate difficult to produce step-out, and when the change rate of continuous data changes rapidly, the change characteristic changes in a direction that it largely inclines. Thus, an indication angle data An+1 continuous from a current indication angle data An is not applied as it is, but this data is changed by the same change amount as a previous change according to $(2An-An-1)=An+(An-An-1)$ and addition/subtraction processing is carried out so that the predetermined value $K=<X$ depending on an increase or decrease of the subsequent change rate. Further, the divided indication angle data Bn is first changed by the same change amount as the previous change according to $(2Bh-Bh-1)=Bn+(Bh-Bh-1)$ and addition/subtraction processing is carried out so that the predetermined value $L=<Y$ depending on an increase or decrease of the change rate. Under the change characteristic that the change rate increases, the change is continued at a just previous change rate so as to follow up that change and further the delayed follow-up can be performed by giving a small increase or decrease. Consequently, it is possible to prevent an occurrence of step-out due to impossibility of follow-up.

According to the driving apparatus of the stepping motor type instrument according to the present invention, if a data change corresponding to a change in measurement quantity is large, an update signal to the stepping motor is delayed so as to follow up the rotary magnet thereby making it difficult to induce step-out. Thus, a complicated structure for restoring a step-out is not needed, that is, a reset mechanism in which zero return is forcibly executed in a full scale temporarily at the time of power ON and a stopper pin is provided so as to make a stop at this stopper pin and reset to an initial point is not needed or incorporation of an encoder for always monitoring for step-out and correction is not needed either. Consequently, a small size, cheap price indication instrument can be provided.

INDUSTRIAL APPLICABILITY

As described above, the present invention utilizes an electric type movement for an indication instrument intended to be thin structured in order to input physical measurement quantity as electric signal and indicate by means of the needle corresponding to a character panel. In particular, this invention is applicable for an indication instrument which smoothly follows up a measurement quantity which changes rapidly.

We claim:

1. A driving apparatus for stepping motor type instrument having a driving circuit for driving a stepping motor according to digital signal corresponding to a measurement quantity and for indicating said measurement quantity by pointing out a graduation on a character panel corresponding to said measurement quantity by means of a needle fixed on a driving shaft end of the stepping motor, said driving apparatus comprising:

processing means in which a digital signal corresponding to said measurement quantity is input and converted to an indication angle signal at a predetermined frequency; and delay means which obtains a difference between continuous indication angle signals front and back output at a conversion frequency of said processing means and, if the difference is larger than a predetermined value, converts the signal so that its change is less than said predetermined value and outputs as an indication angle signal.

2. A driving apparatus for stepping motor type instrument having a driving circuit for driving a stepping motor according to a digital signal corresponding to a measurement quantity and for indicating said measurement quantity by pointing out a graduation on a character panel corresponding to said measurement quantity by means of a needle fixed on a driving shaft end of the stepping motor, said driving apparatus comprising:

processing means for inputting a digital signal D corresponding to said measurement quantity and converting to an indication angle data A at a predetermined frequency; and delay means in which a difference $\Delta A$ of an updated indication angle data $An+1$ output by said processing means relative to a previous indication angle data An is obtained, and if this difference $\Delta A$ is larger than a predetermined value C in terms of its absolute value, said updated indication angle data $An+1$ is rewritten to $An+C$ or $An-C$ depending on its increase/decrease condition and this data is used as said previous indication angle data An for next processing so as to successively update and output the indication angle data.

3. A driving apparatus for stepping motor type instrument according to claim 2, wherein said delay means carries out disassembly step processing for $(An+1-An)/m=Bh$ each at a frequency $T/m$, wherein m is an integer of 2 or more, shorter than the updating frequency T of said indication angle data An and if an absolute value $\Delta Bh$ of a difference of $Bh+1-Bh$ is larger than a predetermined value E, said indication angle data $Bh+1$ is rewritten to $Bh+E$ or $Bh-E$ depending on its increase/decrease condition and this data is used as said indication angle data Bh for next processing so as to successively update the indication angle data.

4. A driving apparatus for stepping motor type instrument according to claim 2, wherein said delay means carries out disassembly step processing for $(An+1-An)/m=Bh$ each at a frequency $T/m$, wherein m is an integer of 2 or more, shorter than the updating frequency T of said indication angle data An, and a change rate of a difference $\Delta Bh$ of $Bh+1-Bh$ and a difference $\Delta Bh-1$ of $Bh-Bh-1$ are obtained, and if a difference of these change rates is larger than a predetermined value Y, said indication angle data $Bh+1$ is rewritten to $2Bh-Bh-1+L$ or $2Bh-Bh-1-L$ (where $0<L=<Y$) depending on its increase/decrease condition and this data is used as said indication angle data Bh for next processing so as to successively update the indication angle data.

5. A driving apparatus for stepping motor type instrument having a driving circuit for driving a stepping motor according to a digital signal corresponding to a measurement quantity and for indicating said measurement quantity by pointing out a graduation on a character panel corresponding to said measurement quantity by means of a needle fixed on a driving shaft end of the stepping motor, said driving apparatus comprising:

processing means for inputting a digital signal D corresponding to said measurement quantity and converting to an indication angle data A at a predetermined frequency; and delay means in which a difference $\Delta An$ of an updated indication angle data $An+1$ output by said processing means relative to a previous indication angle data An and a difference $\Delta An-1$ of said previous indication angle data relative to an indication angle data $An-1$ before the previous one are obtained, and if a difference between these change rates is larger than a predetermined value X in terms of its absolute value, said updated indication angle data $A_{n+1}$ is rewritten to $2A_n-A_{n-1}+K$ or $2A_n-A_{n-1}-K$ (where $0<K=<X$) depending on its increase/decrease condition and this data is used as said indication angle data $A_n$ before the previous one for next processing so as to successively update and output the indication angle data.

* * * * *